(12) United States Patent
Dravid et al.

(10) Patent No.: US 8,647,814 B2
(45) Date of Patent: Feb. 11, 2014

(54) METHOD OF MAKING NANOPATTERNS AND NANOSTRUCTURES AND NANOPATTERNED FUNCTIONAL OXIDE MATERIALS

(75) Inventors: Vinayak P. Dravid, Glennview, IL (US); Suresh K. Donthu, Evanston, IL (US); Zixiao Pan, Evanston, IL (US)

(73) Assignee: Northwestern University, Evanston, IL (US)

( * ) Notice: Subject to any disclaimer, the term of this patent is extended or adjusted under 35 U.S.C. 154(b) by 696 days.

(21) Appl. No.: 11/805,546

(22) Filed: May 23, 2007

(65) Prior Publication Data

US 2008/0070010 A1    Mar. 20, 2008

Related U.S. Application Data

(60) Provisional application No. 60/802,902, filed on May 24, 2006.

(51) Int. Cl.
   *G03C 5/00*     (2006.01)
   *B44C 1/17*     (2006.01)

(52) U.S. Cl.
   USPC ............... 430/296; 250/492.3; 428/195.1; 977/700; 977/831

(58) Field of Classification Search
   USPC ............ 430/313–317, 296; 250/492.1–492.3; 428/195.1; 977/700, 831
   See application file for complete search history.

(56) References Cited

U.S. PATENT DOCUMENTS 5,403,680 A * 4/1995 Otagawa et al. ............... 429/213
6,066,581 A * 5/2000 Chivukula et al. ............. 501/12
2005/0048414 A1* 3/2005 Harnack et al. ............... 430/322

OTHER PUBLICATIONS

Tseng et al. "Electron Beam Lithography in Nanoscale Fabrication: Recent Development". IEEE Transactions on Electronics Packaging Manufacturing, (2003). vol. 26, No. 2, pp. 141-149.*
Castanedo-Perez et al. "Influence of annealing temperature on formation and characteristics of sol-gel prepared ZnO films". J. Vac. Sci. Technol. A, (1999). vol. 17, No. 4, pp. 1811-1816.*
Bogdanov et al. "Fine undercut control in bilayer PMMA-P(MMA-MAA) resist system for E-beam lithography with submicrometer resolution". SPIE vol. 1465 Electron-Beam, X-Ray, and Ion-Beam Submicrometer Lithographies for Manufacturing. (1991), pp. 324-329.*
Chan et al. "Polymer surface modification by plasmas and photons". Surface Science Reports, 24 (1996). pp. 1-54.*
Naoshi Ozawa et al., "Micro pattern formation of ceramic thin film by synthesis from aqueous solution using resist pattern as a mold", Solid State Ionics, 2002, pp. 79-85.

(Continued)

*Primary Examiner* — Prashant J Khatri

(57) ABSTRACT

Method for nanopatterning of inorganic materials, such as ceramic (e.g. metal oxide) materials, and organic materials, such as polymer materials, on a variety of substrates to form nanopatterns and/or nanostructures with control of dimensions and location, all without the need for etching the materials and without the need for re-alignment between multiple patterning steps in forming nanostructures, such as heterostructures comprising multiple materials. The method involves patterning a resist-coated substrate using electron beam lithography, removing a portion of the resist to provide a patterned resist-coated substrate, and spin coating the patterned resist-coated substrate with a liquid precursor, such as a sol precursor, of the inorganic or organic material. The remaining resist is removed and the spin coated substrate is heated at an elevated temperature to crystallize the deposited precursor material.

16 Claims, 13 Drawing Sheets

(56) References Cited

OTHER PUBLICATIONS

Urs P. Schonholzer et al., "Microfabrication of Ceramics by Filling of Phototresist Molds", Advanced Materials, 2000, pp. 1261-1263.

Shu Shimada et al., "Two-Dimensional Ceramic Photonic Crystals Fabricated by a Solution Method", Jpn. J. Appl. Phys. 2003, pp. 6721-6725.

Deying Xia et al., "Directed Self-Assembly of S Silica Nanoparticles into Nanometer-scale Patterned Surfaces Using Spin Coating", Advanced Materials, 2004, pp. 1427-1432.

Deying Xia et al., "A Facile Approach to Directed Assembly of Patterns of Nanoparticles Using Interference Lithography and Spin Coating", Nano Letters, 2004, 1295-1299.

Suresh Donthu et al., "Facile Scheme for Fabricating Solid-State Nanostructure Using E-Beam Lithography and Solution precursors", Nano Letters, 2005, pp. 1710-1715.

Zixiao Pan et al., "Directed Fabrication of Radially Stacked Multifunctional Oxide Heterostructures Using soft Electron Beam Lithography", InterScience, 2006, pp. 274-279.

\* cited by examiner

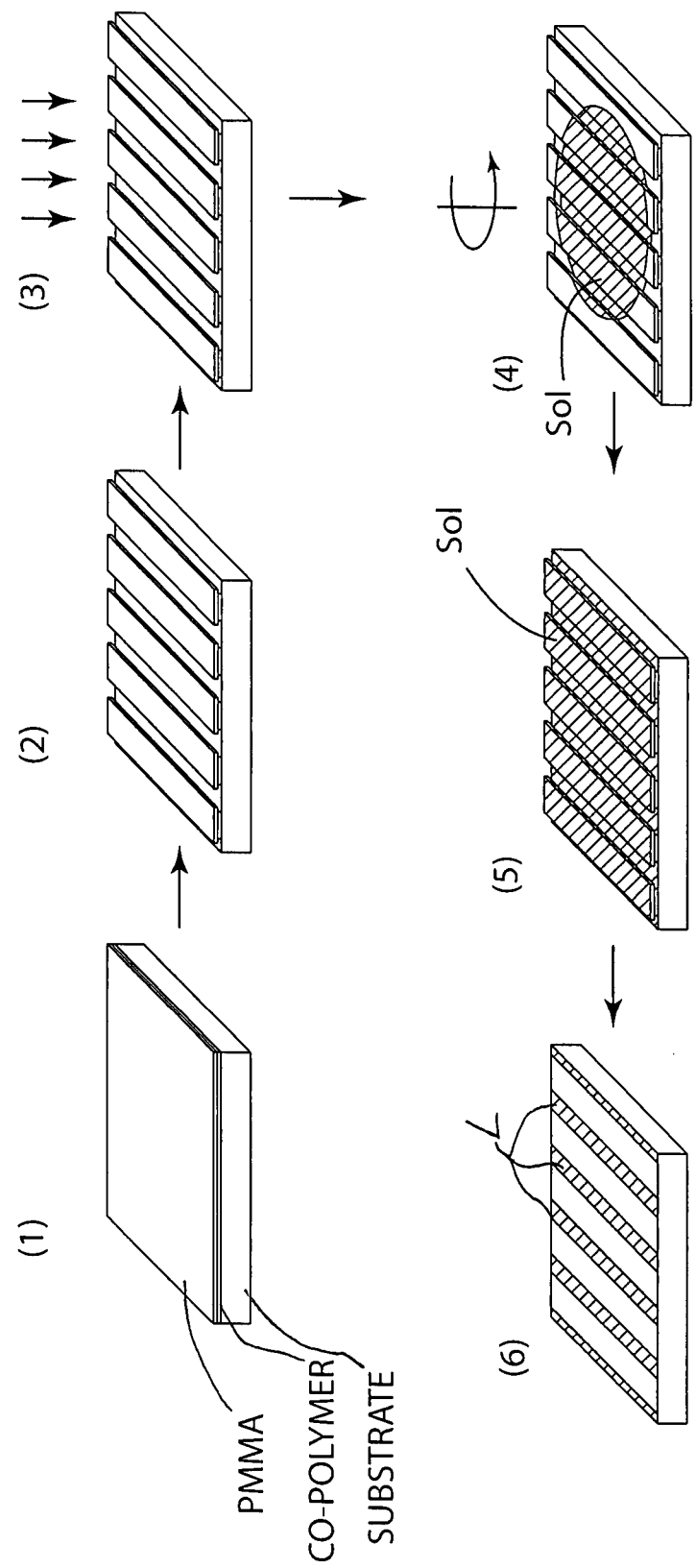

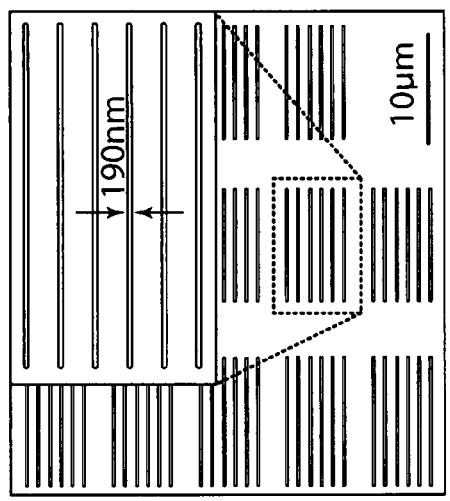
FIG. 3
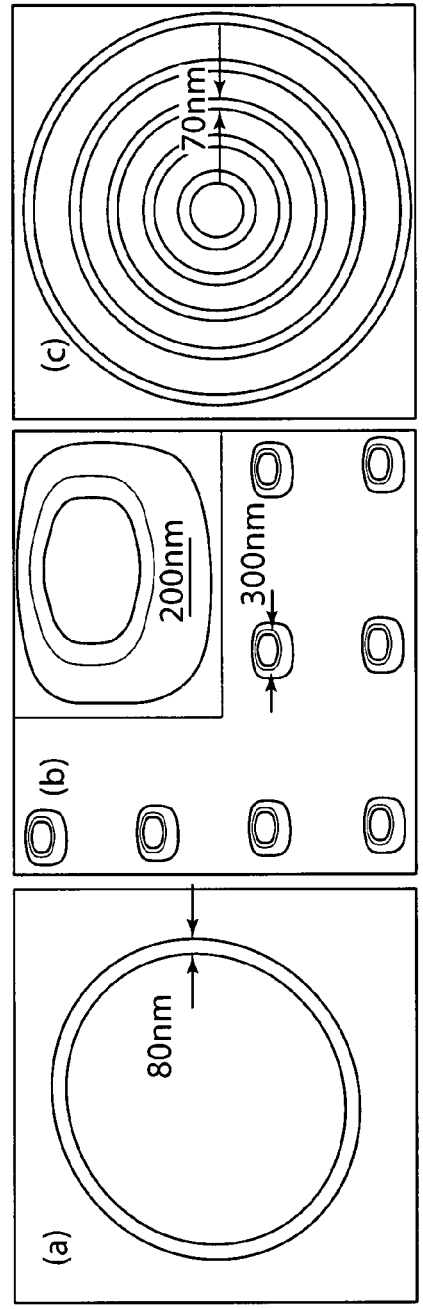
FIG. 4a
FIG. 4b
FIG. 4c

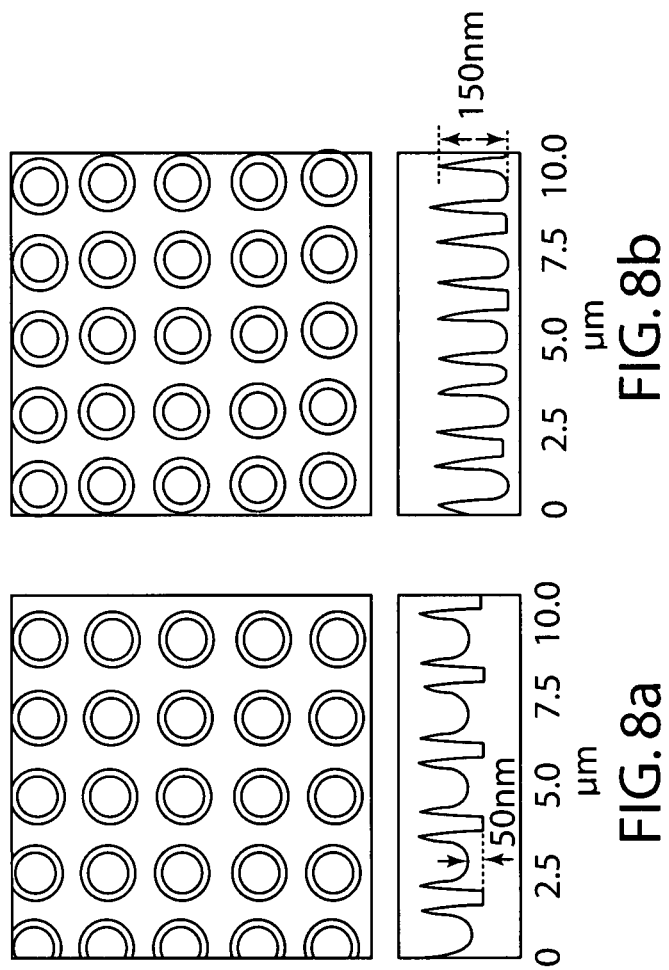

METHOD OF MAKING NANOPATTERNS AND NANOSTRUCTURES AND NANOPATTERNED FUNCTIONAL OXIDE MATERIALS

This application claims benefits and priority of U.S. provisonal application Ser. No. 60/802,902 filed May 24, 2006.

CONTRACTUAL ORIGIN OF THE INVENTION

This invention was supported in part by funding from the Federal Government through the National Science Foundation under NSF award no. EEC-0 118025, NSF-MRSEC (DMR #0520513) and the U.S. Department of Energy (DOE-BES) under Contract No. W-31-109-ENG-38. The Government may have certain rights in the invention.

BACKGROUND OF THE INVENTION

The ability to manipulate materials at nanometer-length scales and control the dimensions of nanostructures is a prerequisite of not only studing novel properties of materials at different length scales but also of realizing useful miniaturized devices. Nanopatterning of materials is one approach that enables these dual goals. Functional ceramics such as ferroelectric (e.g., $PbZr_xTi_{1-x}O_3$ known as PZT), ferromagnetic (e.g., $CoFe_2O_4$ known as CFO), and optoelectronic materials (e.g., ZnO) are very important technological materials for applications such as actuators,' chemical sensors, high density data storage, and polychromic displays. Some of these properties show remarkable size dependency as well as interesting synergistic coupling when materials with different functionalities are positioned in close proximity. The ability to create nanoscale architecture for functional ceramics is desirable.

Although several nanopatterning schemes have been developed during the last two decades, techniques that can pattern ceramics under 100-nm resolution are very limited. This is due in part to the refractory nature of ceramics and the difficulty in etching such materials. Dip-pen nanolithography (DPN) with sol-gel inks has been employed to generate structures under 200 nm. Another high-resolution nanopatterning technique for ceramics is the direct-write using an electron beam. Although this technique was shown to generate very fine structures (<10 nm), it is limited to resists that are sensitive to e-beams and the process typically requires a high electron dose for development of e-beam-sensitive inorganic resists. Other patterning techniques based on molding and replication processes generate ceramic structures over fairly large areas, and direct-write fabrication techniques such as robotic deposition of polyelectrolytes could generate 3D ceramic architectures. However, these techniques do not attain true nanometer-scale patterning resolution.

The past decade has witnessed the emergence of diverse techniques for patterning a wide variety of molecular and "soft" nanostructures within a two-dimensional (2D) regime. However, as the nanostructure paradigm shifts from monolithic single-phase materials and planar geometry to complex compounds and stacked 3D architectures, there is a continuing need for advancing the nonplanar stacking of solid-state structures, especially for multifunctional materials, in a patterned geometry. Heterostructures composed of multifunctional oxides (e.g., multilayer structures) exhibit a fascinating breadth of properties for applications such as microelectromechanics, optoelectronics, microwave devices, and data storage, among many others, based on the interaction between different phases when stimulated by external fields. Recently, vertically aligned heterostructures (such as nanopillars of one phase embedded in the matrix of another) have attracted considerable attention as these nanostructures significantly enhance such interactions. While these vertical heterostructures are fabricated using a phase-separation-based self-assembly approach, a patterning technique that affords controlled dimensions and the separation of such minute structures is highly desirable.

There are considerable challenges in fabricating nonplanar ceramic heterostructure nanopatterns using current "top-down" patterning techniques, which are better suited for the fabrication of single-component 2D structures. The key bottleneck is the stringent requirement on feature realignment between the multiple patterning steps, which are required in order to form nonplanar patterns composed of more than two materials. Such a constraint is particularly critical for nanometer-sized structures as it allows alignment precision at a relatively small scale. Methods such as polymer phase separation, templated growth, interference lithography, and nanotransfer printing have been developed for fabricating nonplanar nanostructures without the need for high-precision feature alignment. However they are demonstrated mainly for metals and polymers, and are not well suited for ceramics. Direct deposition methods such as robotic deposition enable the fabrication of intricate ceramic structures, yet there are restrictions on the deposition environment and the smallest feature size attainable.

SUMMARY OF THE INVENTION

The present invention involves a method for nanopatterning of inorganic materials, such as ceramic (e.g. metal oxide) materials, and organic materials, such as polymer materials, on a variety of substrates to form one or more nanopatterns and/or nanostructures with control of dimensions and locations, all without the need for etching the materials and without the need for re-alignment between multiple patterning steps in forming nanostructures, such as heterostructures comprising multiple materials. The substrates can include, but are not limited to, noble metals, semiconductors, and oxide single crystals. Ceramic materials which can be patterned include, but are not limited to, ferroelectric, ferromagnetic, multiferroic, and optoelectronic metal oxides. Polymer materials which can be patterned include, but are not limited to, electrically conducting polymers.

The invention also involves a nanopatterned structure comprising a functional inorganic material, which can exhibit single-crystalline character, on a substrate. The inorganic material can exhibit single-crystalline character with epitaxial relationship with the underlying substrate. The functional inorganic material is selected from the group consisting of oxide, carbide, nitride, sulphide, arsenide and other complex compounds. Nanopatterned functional oxides include, but are not limited to, $BaTiO_3$, $CoFe_2O_4$ and related functional oxides which exhibit single-crystalline character with epitaxial relationship with underlying appropriately chosen substrate. The invention is readily amenable to fabrication of other inorganic nanostructures, such as and not limited to carbides (e.g., SiC), nitrides (e.g., GaN), as well as chalcogenide structures such as sulphides, arsenides, and complex compounds.

In an illustrative embodiment of the invention, the method involves patterning a resist-coated substrate using electron beam lithography, removing a portion of the resist to provide a patterned resist-coated substrate, and spin coating the patterned resist-coated substrate with a liquid precursor, such as preferably a sol precursor, of the inorganic or organic material. The remaining resist is removed and the spin coated substrate is heated at an elevated temperature to crystallize the deposited precursor material.

In a particular illustrative embodiment of the invention, a bilayer resist is applied on the substrate and then is patterned by electron beam lithography. The bilayer resist comprises an inner, more electron beam-sensitive polymeric material and an outer, less electron beam-sensitive polymeric material. In a particular embodiment, the inner, more electron beam-sensitive polymeric material comprises a methyl methacrylate (MMA) and methacrlic acid (MAA) copolymer, and the outer, less electron beam-sensitive material comprises polymethyl methacrylate (PMMA).

In another particular illustrative embodiment of the invention, the patterned resist-coated substrate is subjected to an oxygen plasma treatment to remove undeveloped resist and to increase the hydrophilicity of the patterned resist. For example, when the above bilayer resist is used, the hydrophility of the patterned surface of the outer PMMA resist layer is increased by the treatment.

In a further particular illustrative embodiment of the invention, the exposed surface of the patterned resist-coated substrate is subjected to chemical surface modification prior to spin coating to alter the exposed substrate surface in a manner to control morphology of the deposited liquid precursor in the subsequent spin coating step. For example, a self-assembled monolayer (SAM) is provided on the exposed substrate surface prior to spin coating with the liquid precursor to yield a nanoring or other annular morphology of deposited precursor material. The nanoring or other annular morphology can be filled with a second, different liquid precursor in a manner to fabricate a heterostructure on the substrate.

In a still further particular illustrative embodiment of the invention, the patterned precursor material is deposited on a single crystal substrate and heated at elevated temperature in a manner that the precursor material crystallies with epitaxy of the single crystal substrate to form a single crystal deposit structure whose crystal orientation and morphology are controlled. The patterned precursor material also can be heated on an amorphous substrate to yield a single crystal depending upon the size of the patterned material.

In an additional particular illustrative embodiment of the invention, the precursor material is patterned on a substrate and heated at elevated temperature in a manner to form a beaded morphology having a width of a single grain.

The invention provides a versatile nanopatterning method suitable for a broad range of material-substrate systems. The types of materials that can be patterned seem to be limited only by the availability of appropriate liquid precursors that are compatible with electron beam sensitive resists. Use of highly sensitive electron beam resists for patterning provides higher patterning speeds. In addition, spin coating is not only a low-cost process but also a high-throughput process. The method permits nanopatterning of inorganic materials and organic materials on a variety of substrates to form nanopatterns and/or nanostructures with control of dimensions and location without the need for etching the materials and without the need for realignment between multiple patterning steps in forming nanostructures, such as heterostructures comprising multiple materials.

DESCRIPTION OF THE DRAWINGS

FIG. 1 is a schematic flow chart illustrating a method embodiment of the invention.

FIG. 3 is a SEM image of polypyrrole patterns on a $SiO_x$/Si substrate.

FIG. 4a is a SEM image showing a PZT ring structure patterned on a Pt/Ti/$SiO_x$/Si substrate. FIG. 4b is a SEM image showing PZT square patterns on a Nb doped strontium titanate (Nb/STO) single-crystal substrate. FIG. 4c is a SEM image showing a ZnO spiral pattern on a sapphire substrate.

FIGS. 8a and 8b are SEM images of PZT rings on bare Au substrate and on an ODT-modified Au substrate surface, respectively, with cross-sectional profiles shown and taken along the horizontal line in FIGS. 8a, 8b.

FIGS. 11a through 11e are SEM images of BFO nanopatterns wherein FIG. 11a shows BFO nanodots of 220 nm in diameter on a Si wafer. FIG. 11b shows BFO nanorings with 80 nm of wall thickness patterned on Pt, which can serve as a bottom electrode for ferroelectric property measurement. FIG. 11c shows $BiFeO_3$ nanolines with 80 nm of linewidth patterned on single crystalline (100) $SrTiO_3$ (STO). FIGS. 11d and 11e show SEM and tapping mode AFM images of BFO dots of 120 nm in diameter and 150 nm in height patterned on Pt.

DETAILED DESCRIPTION OF THE INVENTION

Figure 2A:
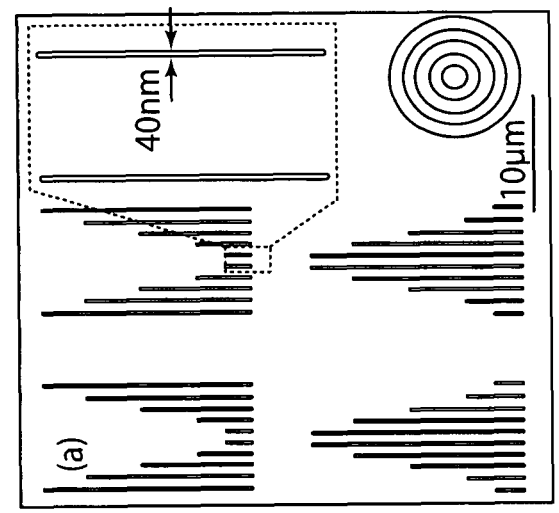
FIG. 2a is a backscattered electron (BSE) image of ZnO patterns on $SiO_x$ substrates annealed in air at 700 degrees C. for 20 minutes.

The present invention involves a method for nanopatterning of inorganic materials and organic materials on a variety of substrates to form one or more nanopatterns and/or nanostructures with control of dimensions and locations. Ceramic materials which can be patterned include, but are not limited to, ferroelectric, ferromagnetic, multiferroic, and optoelectronic metal oxides. Polymer materials which can be patterned include, but are not limited to, electrically conducting polymers. For purposes of illustration and not limitation, functional ceramic materials such as ferroelectric materials (e.g. $PbZr_xTi_{1-x}O_3$ referred to as PZT and $BaTiO_3$ referred to as BTO), ferromagnetic materials (e.g. $CoFe_2O_4$ referred to as CFO), multiferroic materials (e.g. $BiFeO_3$ referred to as BFO), and optoelectronic materials (e.g. ZnO) are important technological materials for applications that include, but are not limited to, actuators, chemical sensors, high-density storage, and polychromic displays and that can be nanopatterned pursuant to the invention to form nanopatterns and/or nanostructures, which can be heterostructures of more than one material. Some of the properties of these ceramic oxide materials can show remarkable size dependency as well as beneficial synergistic coupling when different materials having different functionalities are positioned in close proximity on a substrate.

The method of the invention envisions use of a variety of bulk substrates that include, but are not limited to, noble metals, semiconductors, and oxide single crystals and fragile substartes that include but not limited to ultra-thin silicon nitride membranes. In a particular illustrative embodiment of the invention, a bilayer resist is applied on a substrate and then is patterned by electron beam lithography. The bilayer resist preferably comprises an inner, more electron beam-sensitive polymeric material and an outer, less electron beam-sensitive polymeric material. In a particularly preferred embodiment, the inner, more electron beam-sensitive polymeric material comprises a methyl methacrylate (MMA) and methacrlic acid (MAA) copolymer, and the outer, less electron beam-sensitive material comprises polymethyl methacrylate (PMMA). The invention is not limited to such bilayer resist and can be practiced using other electron beam sensitive resists such as including, but not limited to, poly(1-butene sulfone), poly(methylpentene sulfone) and poly(methyl-α-chloroacrylate-co-α-methylstyrene).

A method embodiment of the invention involves patterning a resist-coated substrate using electron beam lithography, removing resist in a manner to provide a patterned resist-coated substrate, and spin coating the patterned resist-coated substrate with a liquid precursor, such as preferably a sol precursor, of the inorganic or organic material. The remaining resist then is removed and the spin coated substrate is heated at an elevated temperature to crystallize the deposited precursor material. Use of electron beam lithography permits fabrication of patterns and structures with a resolution as small as 30 nm at one or more separate locations on a given substrate and to address and/or manipulate them.

The liquid precursor for nanopatterning of ceramic (metal oxide) materials typically comprises metal-organic precursors such as metal alkoxide solutions, although the invention is not limited to such liquid precursors. The sol-gel precursor typically is applied on the patterned resist coated substrate and gelled by heating as described below for purposes of illustration and not limitation. The liquid precursor for nanopatterning of polymer materials typically comprises a solution of the polymer (e.g. a dilute aqueous solution of the polymer) although the invention is not limited to such liquid precursors for organic materials.

The following EXAMPLES are offered to illustrate embodiments of the invention without limiting the invention:

Example 1

To demonstrate the capabilities of an illustrative method, liquid precursors of technologically important inorganic ceramic oxides ZnO and PZT were evaluated. The liquid ZnO precursor was prepared using chemicals purchased from Sigma-Aldrich Inc. and used in as-received form without further purification. In a typical process, zinc oxide sol is prepared by stirring a mixture of zinc acetate dihydrate, 2-methoxy ethanol, and ethanol amine at 60° C. for 2 hr. The relative compositions were adjusted to give a 0.1 M ZnO sol with equimolar ratio of zinc and ethanol amine. This sol is transparent and remains stable for more than a year.

Referring to FIG. 1, illustrative steps in nanopatterning pursuant to a method embodiment of the invention are shown schematically. The first step (1) is to sequentially spin-coat a surface-oxidized Si substrate ($SiO_x$/Si) with a bilayer structure of electron beam (eb) sensitive resists with a relatively higher eb sensitive MMA-MAA copolymer resist directly on the substrate (as an inner resist layer) and a relatively lower eb sensitive PMMA resist on top (as an outer resist layer). The higher sensitivity copolymer resist can comprise MMA (8.5) and MAA EL6 from MicroChem Corp., USA and the PMMA can comprise 950 PMMA A3 from MicroChem Corp., USA. The higher sensitivity of the inner copolymer resist layer compared to the outer PMMA resist layer affords excellent liftoff. Each layer is spin-coated at 3000 rpm for 45 sec to give a nominal thickness of about 150 nm for each layer.

In step (2), electron beam resist coated substrates are patterned subsequently at 30 kV with line doses between 0.8 and 1.2 nC/cm using Quanta 600F (FEI Co.) electron beam equipment, which can be operated in variable/high-pressure mode for patterning insulating substrates. The same machine is used for subsequent imaging of the patterns.

In step (3), the patterned substrates then are treated with oxygen plasma for 20 sec (75 W, 50 sccrn flow rate, 75 mTorr operating pressure). The purpose of plasma treatment is to not only remove any undeveloped resist in the patterned areas but also to increase the hydrophilicity of exposed substrate. This is beneficial to improve the wettability and effective filling of the patterned areas by the sol.

In step (4), the plasma-treated patterned substrates then are used immediately for spin-coating solutions (e.g. ZnO sols). The sols are spun between 3000 and 6000 rpm for 45 sec and are heated immediately on a hot plate for 10 min at 150° C. in step (5). In step (6), the substrates are soaked subsequently in acetone to dissolve resists, lift-off material outside the patterned areas, and generate solid line structures L with controlled dimensions. The patterned electron-beam resists are used as molds to define the location and size of nanostructures.

Figure 2B:
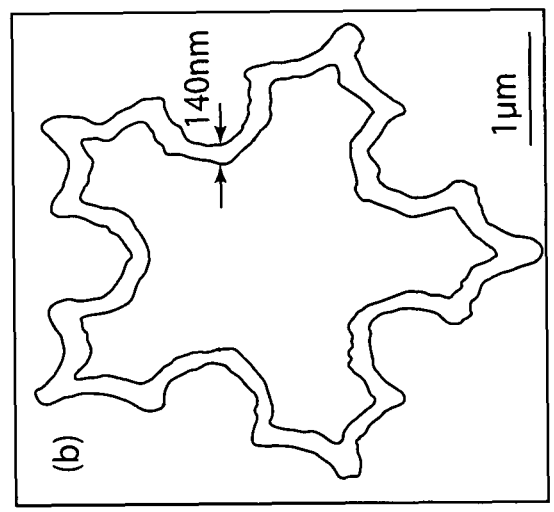
FIGS. 2b and 2c are secondary electron (SE) images of ZnO patterns on $SiO_x$ substrate before and after annealing.
Figure 2C:
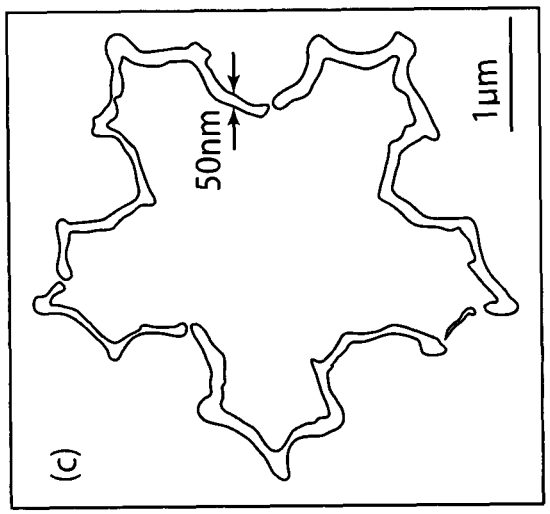

FIGS. 2a, 2b, 2c show scanning electron microscope (SEM) images of ZnO patterns made using the above method on (100) Si substrates with 600-mn-thick thermal oxide The patterns in FIG. 2a annealed at 700° C. for 20 mins in air. FIGS. 2b and 2c show the secondary electron images of ZnO patterns before and after annealing at 700° C. for 20 mins in air to remove most of the organic material. The line width of the ZnO patterns has been reduced to about 40 nm and spacing between lines of about 600 nm, demonstrating the high resolution and high spatial density achievable by the method. In addition, ZnO lines as narrow as 40 nm are continuous over 15 um length even after annealing at 700° C. The effect of annealing on line dimensions can be inferred from FIG. 2b (before annealing) and FIG. 2c (after annealing). These two images show that line widths decrease by nearly 70% upon annealing in air at 700° C. for 20 min due primarily to combustion of organics. From atomic force microscope (AFM) measurements (not shown), it is noticed that the height of the lines shrinks on average by about 50% after this annealing step from 200 to about 100 nm. Taking into account only the shrinkage in width and height of a typical line pattern, these values translate to about 85% volume shrinkage. Despite such large volume changes, the lines remain continuous over the entire length indicating perhaps that these lines might contain high nanoscale porosity, which is well known in ceramic thin films prepared via sol-gel route. This could prove very valuable for their sensor and catalytic applications.

Example 2

This example is provided to illustrate that an organic material can be patterned using a dilute solution of polypyrrole, a popular conducting polymer, on a $SiO_x/Si$ substrate surface. Polypyrrole in 3% water was received as a black solution with proprietary organic acids from Sigma-Aldrich Inc. This solution was further diluted to a 1:3 ratio of polypyrrole to water and was used for patterning polypyrrole patterns with different line widths and spacing, FIG. 3. The method steps were the same as those described with respect to EXAMPLE 1.

Example 3

This example demonstrates that the above method embodiment can be practiced to nanopattern diverse material systems with a variety of substrates. For example, FIG. 4a shows a PZT ring structure having a wall thickness of 80 nm patterned on a $Pt/Ti/SiO_x/Si$ substrate using the method of FIG. 1 with a transparent and highly stable 0.1 M PZT sol. FIG. 4b shows 500-nm-wide PZT square patterns on a Nb doped strontium titanate (Nb/STO) single-crystal substrate. FIG. 4c shows a ZnO spiral pattern on a sapphire substrate.

The 0.1 M PZT sol was prepared using lead acetate and titanium isopropoxide and zirconium-n-butoxide as respective metal precursors. These precursors were mixed with a 1:1 volume mixture of acedic acid and 2-methoxyethanol. The entire solution was heated at 70 degrees C. while continuously stirring for 2 hours.

The patterns in FIGS. 4a and 4b were annealed at 600 for 2 hr in air. The height difference at the edges of the square patterns in FIG. 4b is a result of undercut due to higher sensitivity of the copolymer compared to PMMA as explained below. The effect of undercut is more prominent in these patterns because relatively high electron beam doses (2 nC/cm) were used. FIG. 4c shows ZnO patterns on another technologically important substrate, sapphire. Although the substrates in FIGS. 4a and 4b are electrical conductors, sapphire is an insulating material.

The different substrates in FIGS. 4a, 4b, and 4c were chosen as representative for different classes of materials: polycrystal, single-crystal, insulating, and conducting. Through these results, the applicability of the method to a wide selection of substrate-material systems is demonstrated and highlight the remarkable versatility of the method. These results are particularly interesting from the point of obtaining ceramic nanostructures and possibly single-crystalline structures with a known epitaxial relationship to the appropriate substrate, and ultimately enabling one to engineer the microstructure of the nanopatterns through a careful choice of substrate and annealing scheme.

Example 4

Figure 5:
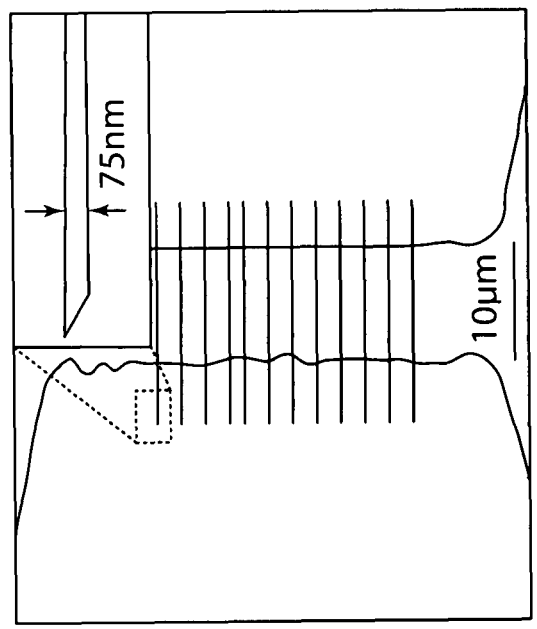
FIG. 5 is a SEM image of ZnO lines patterned across Au electrodes with 10 micrometer gap with the inset showing an enlargement of a ZnO line. The ZnO lines were heated at 150 degrees C. in air for 10 minutes.

Although the invention is useful for nanopatterning a variety of materials, one of the primary goals of patterning is to fabricate miniaturized devices. This example demonstrates one such device through the fabrication of ZnO nanostructures and probing their UV photosensing properties. FIG. 5 shows a SEM image of 75 nm wide ZnO lines patterned using this method across gold electrodes with a 10-um gap. The gold electrodes were fabricated previously on a SiOx/Si substrate using conventional photolithography. The electrodes consist of 30 nm Au on top of 5 nm Ti deposited by an e-beam evaporation technique. The ZnO lines in FIG. 5 were heated only at 150° C. for 10 min and therefore are not likely to be crystalline. These ZnO lines were found to be highly resistive in room light, whereas their resistance decreased by 3 to 4 orders of magnitude when they were exposed to 254 nm light. All of the electrical measurements were performed at room temperature. At a 5 V bias, the resistivity of each ZnO line under 254 nm light was about 6 MΩ-cm. The current modulation upon exposure to 254 nm UV light in air was evaluated. Both the response and recovery time were about 2 sec, which is comparable to the performance of ZnO nanowires. This is even more interesting because unlike nanowires, these ZnO line patterns are not crystalline, suggesting that high crystallinity is not a prerequisite for superior performance of ZnO nanostructures for photodetector applications. Although their performance should be thoroughly evaluated for long-term stability, this result nevertheless demonstrates the high performance capability of ZnO nanostructures prepared using this scheme.

Example 5

In this example, the substrate (platinized silicon) was spin-coated with a bilayer electron-beam resist, see FIG. 1 step (1), consisting of a methyl methacrylate (MMA) and methacrylic acid (MAA) copolymer as the inner resist layer on the substrate and a polymethyl methacrylate (PMMA) layer on the top as the outer resist layer, each with a nominal thickness of about 150 nm. The higher electron-beam sensitivity of the copolymer as compared to PMMA enables excellent lift-off in a bilayer configuration, and plays a critical role in controlling the geometry of the fabricated nanostructures, as elaborated below. The resist-coated substrates were electron-beam patterned, see FIG. 1 step (2) with an array of circular (1 μm diameter) or square discs (1×1 μm), rather than the lines shown in FIG. 1. After being developed, the patterned substrates were treated with the oxygen plasma to remove any organic residue left in the patterned area and to increase the hydrophilicity of the resist to enable filling of the patterned discs with aqueous sol, FIG. 1 step (3). Subsequently, a PZT sol (0.1M) was spun onto the patterned substrates between 4000 and 6000 rpm for 40 sec, FIG. 1 step (4) and the samples were immediately heated at 150° C. for 5 min to gelate the patterns, FIG. 1, step 5. The samples were then soaked in acetone to dissolve the resist and to lift-off excess sol material from the unpatterned areas, FIG. 1, step (6).

A $Pb(Zr_{0.3}Ti_{0.7})O_3$ (PZT) sol was prepared as described above in Example 1. A 0.1 M CFO sol was prepared by dissolving appropriate portions of $Co(CH_3COO)_2 \times 4H_2O$ and $Fe(NO_3)_3 \times 9$ $H_2O$ in 2-methoxyethanol, with 10 vol. % ethanolamine as a complexing agent. The solution was refluxed at 70° C. for 4 hr, cooled, filtered, and applied as described above. Both as-prepared sols were clear and were stable for more than six months.

Figure 7A:
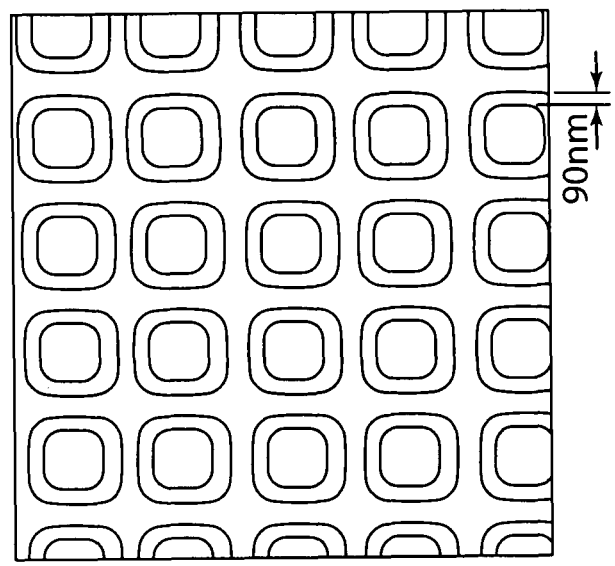
FIG. 7a is a SEM image of PZT rings on a platinized silicon substrate.

The square patterns of PZT fabricated on platinized silicon substrates made using the method after spinning the substrates at 6000 rpm are shown in FIG. 7a. Atomic force microscopy (AFM) topographic images and the cross-sectional profile indicate that the square patterns have in fact developed into barrel shapes such as would occur with liquid in a spinning beaker. Each barrel had a wall thickness of about 90 nm and a height of 150 nm, as analyzed from the AFM profiles. After annealing this sample at 600° C. for 1 hr in air, the wall thickness was reduced by nearly 30% to about 60 nm. Scanning electron microscopy (SEM) images of the annealed patterns indicated that the grain size of the bottom Pt coated substrate, inside as well as outside of the pattern, can be observed from backscattered electron (BSE) images. However, secondary electron (SE) images showed residual islands of PZT at the bottom of the barrels and that the substrate surface is not completely clean. The thin layer of PZT sol left on the inside surface is likely due to the hydrophilic nature of the Pt coated substrate surface. This result indicates that by varying the surface property of the exposed substrate area, the shape of the ceramic structures can be tuned. Further, building radially stacked heterostructure patterns can be possible if the bottom center of the patterns are made free of spin-coated material to attain a pure (bottomless) ring geometry. By simply filling the rings with another functional oxide sol, columnar core C-ring R architectures can be fabricated without the need for painstaking realignment and multistep patterning.

Figure 6:
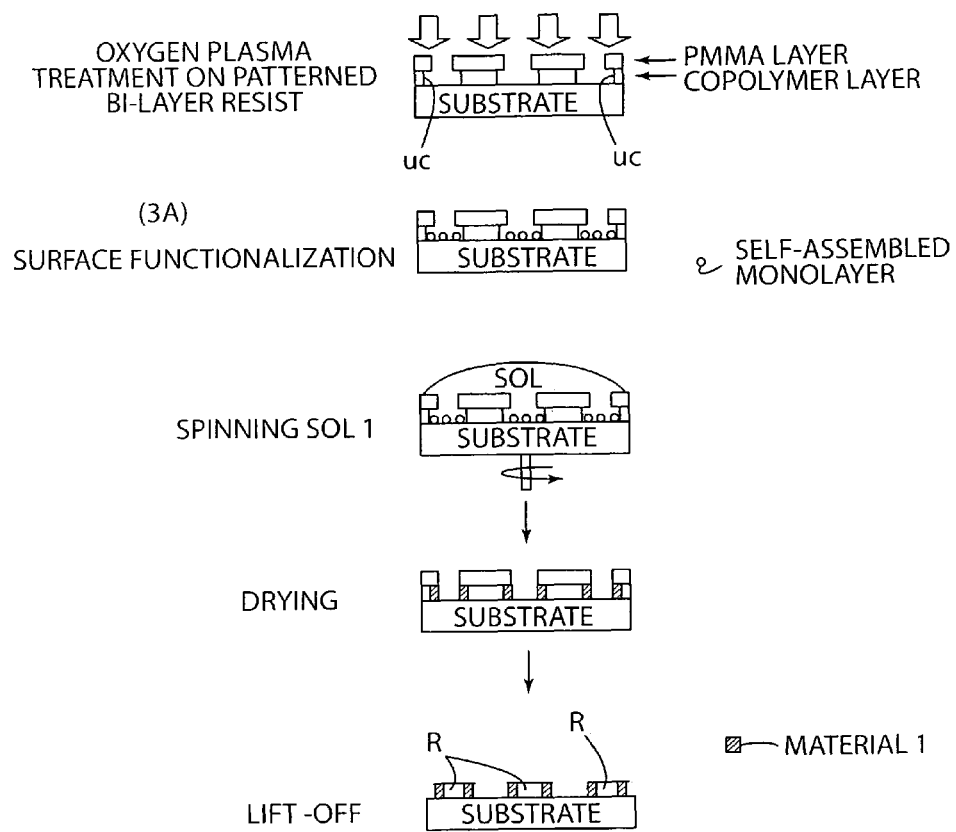
FIG. 6 is a schematic flow chart illustrating another method embodiment of the invention employing a SAM treatment of the substrate surface.
Figure 7:
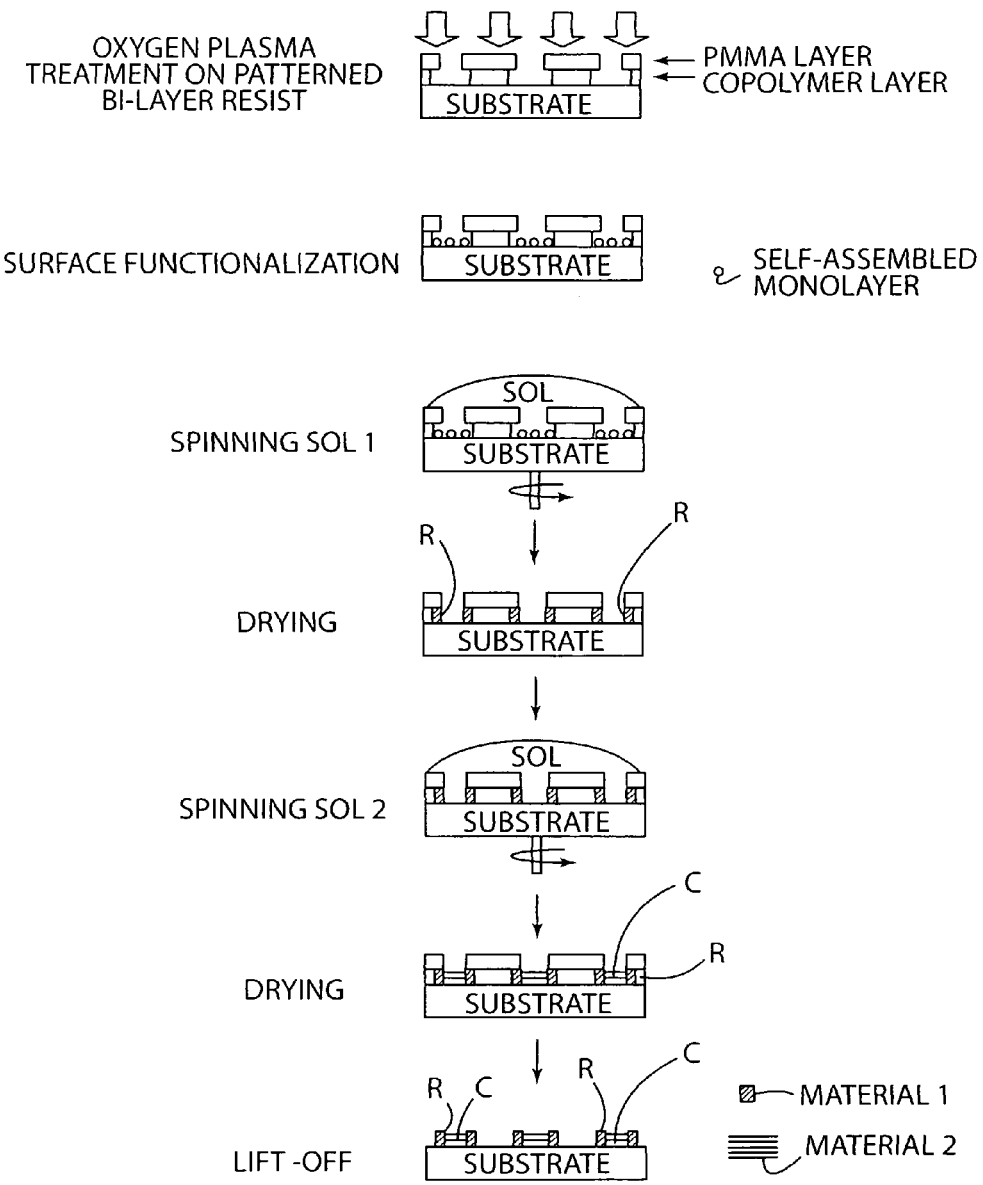
FIG. 7 is a schematic flow chart illustrating still another method embodiment of the invention employing a SAM treatment of the substrate surface and spin coating of two different sol precursors to fabricate nanorings of a first material and having a core of a second material therein.

To this end, this further example involves fabrication of radially stacked heterostructures of multifunctional oxides from their sol precursors. Well-defined nanorings of lead zirconate titanate (PZT) were fabricated on a variety of substrates such as noble metals (e.g., Au), semiconductors (e.g., Si), and oxide single crystals (e.g., $SrTiO_3$), which were previously functionalized with appropriate self-assembled monolayers (SAMs) as illustrated in FIG. 6. The undercut UC shown in the bilayer resist and substrate functionalization with the SAM treatment provide for formation of the ring structures. The nanorings are then used as "containers" and are filled with a second sol (e.g., $CoFe_2O_4$) to form radially stacked composite ceramic heterostructures as illustrated in FIG. 7. The examples presented herebelow does not require either feature alignment to realize heterostructures or the etching of ceramics, and is amenable to a variety of radially stacked composite heterostructures.

The method for patterning radially stacked multifunctional oxide heterostructures without the need for feature alignment or etching is based on the above-described method (FIG. 1) modified as shown in FIG. 6 to include use of appropriate self-assembled monolayers (SAMS). For convenience, FIG. 6 is shown beginning with step (3) involving oxygen plasma treatment of the patterned substrate.

For example, the nanoring structures of one inorganic material with ring widths less than 100 nm are first fabricated from its sol precursor after modifying the solvophobicity of substrates using appropriate self-assembled monolayers (SAMS) as illustrated in FIG. 6. Such rings are then utilized as building-block "containers" by filling them with a second sol to form radially stacked "core-ring" heterostructure patterns as illustrated in FIG. 7. This directed patterning of oxide heterostructures is successfully achieved on diverse substrates with control over their dimensions, and it avoids a painstaking feature-alignment procedure between patterning of the first and second materials.

One way to keep the substrate surface inside of the ring free of sol material is to increase the contact angle of the sol with the substrate, which is achieved in this further example through chemical modification using SAM. For example, 1-octadecanethiol (ODT) and octadecanetrichlorosilane (OTS) can effectively increase the contact angle of water or alcohol on noble metal and silicon oxide surface, respectively. Further, the SAM modification procedure is compatible with the method of FIG. 1.

Therefore, SAM was utilized as illustrated in FIG. 6, step (3A) after developing the patterns in the bilayer resist and using the oxygen plasma treatment to render a hydrophobic substrate surface and thus pure annular nanoring structures R after the spin coating step as schematically illustrated in FIG. 6.

In particular, Si substrates (with a 60-nm layer of thermal oxide) were functionalized with OTS, while Au-coated substrates (30-nm-thick Au sputter-coated Si substrates with a 5 nm Ti adhesion layer) were functionalized with ODT. The functionalization step is shown as step (3A) in FIG. 6. The treated substrates were immediately used for spin-coating the PZT sol (0.1M). The subsequent, steps of drying and lift-off are the same as described with respect to FIG. 1. Sol patterning was performed on the same substrate but without SAM treatment for control experiments.

SAM modification of the patterned substrates was carried out by immersing the Au-coated substrates in a 3 mm ODT-isopropanol solution for 3 hr and the bare Si substrates in OTS-anhydrous hexane solution for 20 hr. The substrates were then thoroughly rinsed with the corresponding solvents, blown dry with nitrogen, and immediately used to form ring patterns.

The AFM topographic images and cross-sectional profiles of PZT structures on unmodified and ODT modified Au/Ti/$SiO_x$/Si substrates are shown in FIGS. 8a, 8b, respectively. From corresponding cross-sectional profiles of FIG. 8a, 8b, it can be noted that PZT structures form as barrels on unmodified substrates with a thick film of nearly 50 nm at the center of each barrel. In contrast, the ODT modified surface generates a pure ring structure with the same height inside as well as outside of each ring. Chemical maps were obtained using secondary ion mass spectroscopy (SIMS) to further confirm the absence of PZT at the bottom of the rings. The $Ti^+$ ion map of the pattern clearly showed that the interior of each ring was devoid of any PZT material, and therefore validates the AFM results. Similar results have been observed on OTS-modified Si wafers, where both AFM and SIMS images offered clear evidence for the PZT ring formation. Besides the modification on noble metal and Si substrates, this method was also extended to complex oxide substrates, such as $SrTiO_3$ (STO) single crystals. Such perovskite-structured substrates have excellent structural compatibility with PZT and may provide control over PZT crystallography (e.g., high texture or epitaxy).

PZT structures have been patterned on STO single-crystal substrates by using the process shown in FIG. 6. SEM images of a PZT ring on OTS-treated STO crystal substrate demonstrated the effectiveness of OTS treatment on the ring-structure formation. PZT rings also have been patterned on a $SiN_x$ substrate surface using this method. These collective results demonstrate the effectiveness and broad applicability of substrate functionalization with SAMs as an approach to realize pure oxide rings with nanoscale ring wall width on a variety of substrates. The method is highly reproducible and can be readily used to pattern areas as large as 1 $mm^2$ with a plurality of oxide rings.

In addition to the substrate surface modification through SAM treatment described above, the undercut of the bilayer resist designated UC in FIG. 6 also facilitates in defining the geometry of the ring structure. The undercut profile is created due to the higher electron beam sensitivity of the bottom copolymer layer compared to the top PMMA layer. In this example, the undercut length (defined as the length of the PMMA layer overhanging the copolymer layer) was about 100 nm as determined from cross-sectional SEM images, which is close to the width of the PZT rings shown in FIG. 8b. In addition, the thickness of the PMMA and the copolymer was about 150 nm each, which is remarkably close to the height of the PZT rings. Although Applicants do not wish to be bound by any theory or model, this suggests the following explanation for the formation of ring structures. The undercut profile functions in a way analogous to an aperture on top of a barrel. It allows part of the sol to be expelled under high rotational speeds, yet retains the remaining sol, which is pushed to the perimeter of each disc and preferentially accumulates there due to the solvophobicity of the bottom substrate surface to form the ring structures after drying. Thus, the PZT ring height is determined by the thickness of the copolymer resist layer and the width is defined by the undercut length. The above model was confirmed through control experiments wherein when a 300 nm-thick PMMA single layer was used (instead of a bilayer resist of the same thickness) and patterned using the process shown in FIG. 6 and wherein substrates are treated with SAMs, nearly 90% of the patterned area was devoid of ring structures. Moreover, the height and thickness distributions of the rings in the rest area were nonuniform. The low yield and poor geometric uniformity therefore underscore the significance of the undercut UC.

Based on the controlled formation of the nanoscale rings as illustrated in FIG. 6, radially stacked vertical heterostructure patterns were developed by spin coating the sol of a second different material to fill the rings of the first material and form the "core" C as shown in FIG. 7. This process can be repeated for additional radial stacking.

Figure 9A:
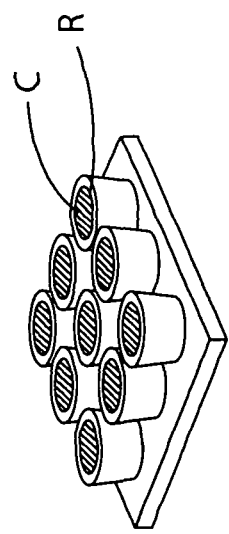
FIG. 9a is a schematic illustration a core-ring heterostructure and FIG. 9b is an TEM image of such columnar core-ring heterostructures on a Pt/$SiO_x$/Si substrate, before annealing at 700° C. for 1 hr.
Figure 9B:
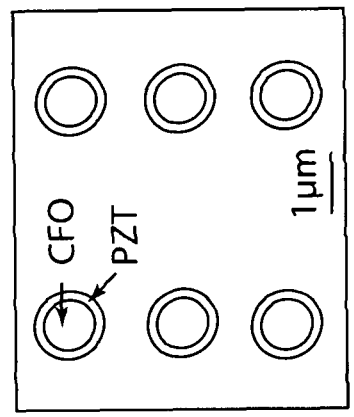

In particular, $CoFe_2O_4$ (CFO) was chosen to be the "core" material due to its high magnetostrictivity and relatively high Neel temperature. Also, CFO and PZT have commensurate lattice parameters. This innate structural compatibility between the two phases with large magnetostriction or electrostricition (i.e., piezoelectricity) can enhance magnetoelectric coupling effects when made into appropriately aligned heterostructures particularly for a "vertically aligned" geometry. The patterning procedure for the heterostructure formation is illustrated in FIG. 7. PZT sol (designated sol 1) was first spun at 6000 rpm on SAM-treated substrates and heated at 150° C. for 5 min to generate PZT rings R. This was immediately followed by cooling the substrate and spinning the CFO sol (designated sol 2) at 5000 rpm to fill the PZT rings. Preparation of the CFO sol is described above. The lower spinning speed for the core material was used because it yields a smaller centrifugal force on the spinning liquid, and thus results in a larger bottom thickness of the barrels after drying. The substrates were then heated to 150° C. again and soaked in acetone to lift off material outside patterned areas. FIG. 9a shows a schematic illustration and FIG. 9b is an TEM image of such columnar core-ring heterostructures (on a $Pt/SiO_x/Si$ substrate, before annealing at 700° C. for 1 h). The PZT shell is around 90 nm thick. Similar heterostructures have been fabricated on $SiN_x$ surfaces treated with OTS. The TEM images taken before annealing (FIG. 9b) and after annealing (not shown) at 750° C. in air for 1.5 hr further corroborate the core-ring geometry. The average width of the ring is about 90 nm after annealing. An electron diffraction pattern taken from one of the heterostructure patterns shows polycrystalline rings, and the diffraction rings correspond well to PZT (tetragonal phase) and CFO. This indicates that both the core material and the ring or shell material have crystallized after annealing, and thus demonstrate the feasibility of this method in preparing solid heterostructures with appropriate ceramic phases. There was no hint of a third phase in the diffraction profile, suggesting the phase purity of the heterostructures.

These collective examples described above indicate that this method embodiment of the invention provides a facile and general route to fabricating oxide heterostructure patterns with excellent control over pattern dimensions from both bottom-up and top-down directions: SAM treatment determines the pattern shape (i.e., ring or barrel), while the high-resolution electron beam lithography and the undercut (UC) profile simultaneously provide more rigorous control over the dimensions of the structure (i.e., thickness and height of the ring or shell, diameter of the core, and so on). It does not require painstaking feature realignment between steps to generate the shell and to place the core inside the sub-100-nm-thick ring or shell, and the spin-coating technique used eliminates the need for subsequent etching.

This method can be further extended to fabricate other radially stacked structures (e.g., concentric multiring patterns) if the appropriate spinning speed and optimal substrate-surface property control can be utilized. On the other hand, in addition to patterning on different substrates, heterostructures of different oxide systems such as ZnO/PZT and $BaTiO_3$/CFO also have been patterned. This method should be broadly applicable to patterning solid-state structures from any appropriate liquid precursor or solution (e.g., sols, liquid-phase polymer precursors, and colloid particle suspensions) that are compatible with electron beam resists.

By controlling the surface solvophobicity with SAM treatment, this method enables the generation of nanoscale elements from micrometer-sized patterns. PZT rings with widths smaller than 100 nm were first prepared on various substrates including Au, $SiO_x$, $SiN_x$, and single crystal STO. The undercut geometry and SAM treatment are critical for ring formation. Columnar core-ring-type heterostructures were then fabricated by filling such rings with a CFO sol. This two-step method of FIG. 7 enables the patterning of radially stacked heterostructures of important multifunctional oxides without the need for feature realignment or etching steps, which may prove valuable for the design of new functional materials and devices.

The patterned structures were characterized in this example using SEM (Quanta 600F, FEI Company, USA), TEM (H-8100, Hitachi, Japan), AFM (Nanoscope III microsope, Digital Instruments, USA), and SIMS (PHI TRIFT III, Physical Electronics, USA).

Example 6

In this example, nanodisk arrays of technologically important magnetic ($CoFe_2O_4$) and ferroelectric ($BaTiO_3$) oxides were fabricated on diverse substrates with well-defined size and separation using the method embodiment similar to FIG. 1. This example demonstrates that below a certain pattern size, the as-deposited amorphous nanodisks can be readily converted into dense, single-crystal form that exhibit cube-on-cube heteroepitaxy with respect to the underlying single-crystal substrate. Particularly, when patterned on substrates with commensurate lattice constants, the single-crystal CFO and BTO nanodisks present truncated-pyramid morphology with well-defined facets. Such solution-based epitaxial conversion of patterned arrays of multifunctional oxides has potential for viable cost-effective technological applications.

In this example, CFO was patterned on single crystal (100) $SrTiO_3$ (STO) (with −7.4% lattice mismatch), whereas BTO was patterned on (100) SrRuO$_3$-coated SrTiO$_3$ substrate (SRO/STO) (with −1.5% lattice mismatch between BTO and SRO). Patterning was also performed on electron transparent amorphous SiN$_x$ membrane for direct observation under transmission electron microscopy (TEM). The patterned structures were characterized using scanning electron microscopy (SEM, Quanta 600F, FEI Co.), TEM (JEM-2100F, JEOL, Japan), and atomic force microscopy (AFM, Nanoscope III microsope, Digital Instruments).

The as-deposited patterns are in the form of amorphous dry gel containing organic residue. In order to crystallize and fully densify the patterns, all patterned samples were annealed at 1000° C. in air. During annealing, the pattern dimension decreases in both vertical and lateral directions, resulting from both the elimination of organic component and the phase change from an open-structured amorphous state to a dense crystalline structure. Typical AFM images of the patterned CFO arrays on STO substrate after annealing exhibited size uniformity of the CFO patterns. The cross-sectional profile of each disk shows a uniform diameter of about 150 nm and height of about 90 nm.

Figure 10C:
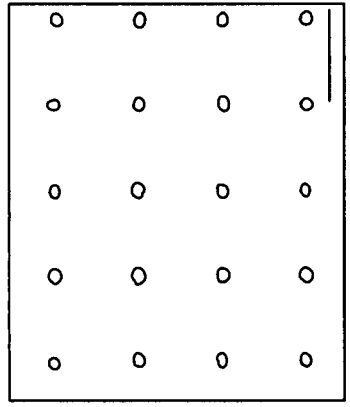
FIGS. 10a through 10c are SEM images of CFO disks with 500, 200, and 100 nm diameters, respectively.
Figure 10B:
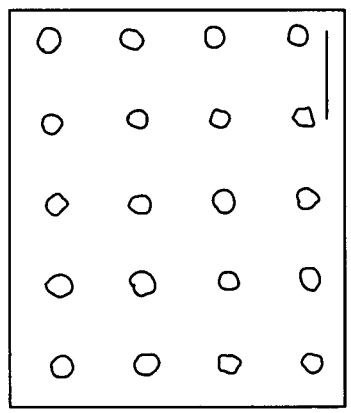
Figure 10A:
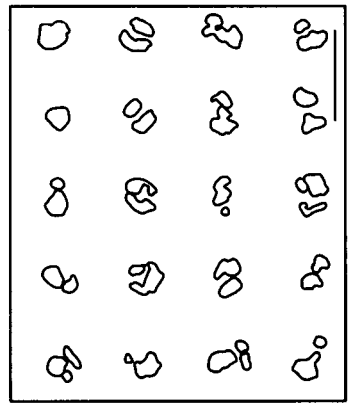
Figure 10F:
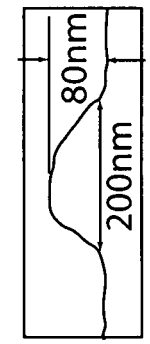
FIG. 10f is a cross-sectional profile along the dashed white line of FIG. 10e.

Referring to FIG. 10a through 10f, crystallized CFO disk samples with different pattern diameters on STO substrate were made in order to evaluate the influence of pattern size on the morphology and crystallinity of the CFO disks. For example, FIGS. 10a, 10b, and 10c are SEM images (scale bar is 1 micrometer) of CFO disks with 500, 200, and 100 nm diameters, respectively. The height of the final patterns for different samples generally falls in the range of 80-100 nm.

Figure 10E:
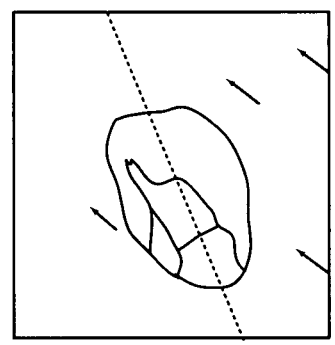
FIGS. 10d through 10e are AFM phase images of CFO disks with 200 nm diameter. The line contrast on the substrate in FIG. 10e comes from the terraces on the (100) STO substrate due to its surface reconstruction during annealing.
Figure 10D:
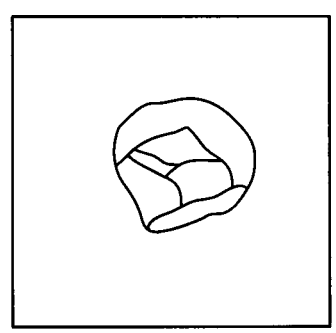

In FIG. 10a, the 500 nm diameter patterns appear to break into several isolated crystallites. This tendency of breaking is significantly diminished for smaller diameter patterns. In fact, two types of morphologies are observed to coexist for pattern diameter between 500 and 200 nm: one showing a polycrystalline CFO network with small pores trapped inside, and the other with dense CFO disks. Patterns with 200 nm and smaller diameters (FIGS. 10b and 10c) are all developed into fully dense nanodisks. In order to obtain explicit evidence for crystallinity of smaller patterns, tapping mode AFM phase images were taken on the 200 nm diameter disks. AFM phase image can provide superior grain boundary contrast especially when grains are smaller than 20 nm. From typical phase images of 200 nm diameter patterns as shown in FIGS. 10d and 10e, no grain boundary features are observed. AFM results also confirmed the faceted shape of the annealed CFO patterns, which is consistent with the Wulff construction for cubic m3m point group symmetry (truncated octahedron with {100} and {111} facets, shown in FIG. 10f. In fact, the sharp angle between the side/bottom surfaces measured from cross-sectional profiles of FIG. 10e is around 56-58°, corresponding well to the angle between cubic {100} and {111} planes (57.4°). This suggests the single crystal nature of the nanopatterns and their uniform cube-on-cube epitaxial orientation with respect to the substrate.

TEM investigation on a plan view sample (CFO 200 nm diameter disk arrays on STO (100) substrate after annealing) provided unambiguous evidence of the single-crystal nature and detailed information on the orientation of the nanodisks. A well-defined pattern shape was readily observed. A typical selected area diffraction (SAD) pattern obtained from one such disk further revealed the cube-on-cube heteroepitaxy between the single-crystal CFO nanodisks and the STO substrate. This heteroepitaxy implies that one magnetocrystalline easy axis (i.e. (100)) of CFO nanopatterns is aligned normal to the substrate plane, which is highly favorable to harness the magnetization direction of such nanopatterns. The method of this example may be used for fabrication of textured or epitaxial ferrite miniaturized structures which now are fabricated mainly by high-energy deposition (e.g., pulsed laser deposition, magnetron sputtering, and molecular beam epitaxy) with careful monitoring of the film growth.

The single-crystal conversion and shape control strategy of this example can be readily applied to other functional oxide/substrate systems, such as for purposes of illustration and not limitation, BTO patterns on an SRO/STO substrate. From the original circular disks defined in electron beam resist using the method described above, BTO patterns have developed into a perfect truncated pyramid shape after annealing. Unlike CFO on STO, BTO patterns on SRO do not contain the {100} small side facets, probably due to its different surface energy anisotropy and the smaller lattice mismatch with SRO substrate. The single-crystal conversion therefore reveals the potential of this method embodiment for structural engineering via nanopatterning, i.e., to obtain polycrystalline or single-crystalline ceramic nanostructures through controlling the pattern size and to achieve specific crystallographic orientation of the nanostructure by choosing proper substrates.

The method embodiment of this example may develop single crystal patterns even on amorphous substrates (such as SiN$_x$), when the pattern dimensions are small enough. For example, CFO nanodisks with 50 nm final diameter were patterned on an electron transparent SiN$_x$ membrane window (SiN$_x$ thickness of 50 nm). Patterns on electron transparent window may serve as a test bed for directly probing the localized structural/chemical information of the nanostructures using TEM without any further sample preparation steps. Scanning transmission electron microscopy (STEM) images of the 50 nm diameter nanodisk patterns indicated their single-crystal structure. A nanosized electron probe was used for chemical analysis of the nanodisks in this sample. The energy dispersive X-ray spectroscopy (EDS) spectrum obtained from the disk and the plain membrane confirmed the chemical constituents of the patterns.

Crystallized CFO patterns of 250 nm diameter on a STO substrate were probed using lift-mode magnetic force microscopy (MFM) where an area of 5×5 disk array was scanned before and after magnetization in a 0.3 T out-of-plane static magnetic field. The magnetic force response was collected under phase detection mode. The topography information was recorded simultaneously. The phase contrast from the disks before magnetization suggests that most CFO disks have an out-of-plane spontaneous magnetization component (coming out normal to the substrate). The reversed contrast after magnetization indicates the magnetic configuration change influenced by the external field and thus identifies the active magnetic nature of the CFO nanopatterns.

This example demonstrates a versatile nanofabrication strategy that allows for conversion of functional oxide nanopatterns into their single crystal form and control over their crystalline orientation and morphology. The flexibility of the method described allows patterning diverse oxides into nanodevices in order to explore their behavior at different length scales. In addition, since magnetic oxides can be combined epitaxially into vertical heterostructures with perovskite ferroelectrics and high-temperature superconductors, this technique also opens up the possibility of fabricating all-oxide heterostructures with novel functionalities.

Example 7

This example involves fabrication of multiferroic BiFeO$_3$ (BFO) by a method embodiment of the invention wherein BiFeO$_3$ nanopatterns with less than 100 nm characteristic dimension are fabricated from its liquid-phase precursor on diverse substrates. The ferroelectric behavior is confirmed by piezoresponse force microscopy (PFM). Furthermore, the BFO nanolines patterned on SrTiO₃ substrate exhibit a bamboolike structure, which can serve as an excellent model system for investigating the contribution of grain boundaries to the leakage current.

BiFeO₃, a rhombohedrally distorted perovskite, has long been known as a multiferroic material with ferroelectric ($T_c$ approximately 1103 K) and G-type antiferromagnetic ($T_N$ approximately 643 K) properties. Its unique feature of exhibiting both these properties at room temperature is highly favorable for applications such as lead-free ferroelectrics used for nonvolatile random access memory.

The method embodiment employed a sol-gel precursor of BFO prepared by dissolving Bi(III) acetate and Fe(III) acetylacetonate into the solution of acetic acid and de-ionized water and stirring at 50° C. for 3 hr. An excess amount of $Bi^{3+}$ source (2 mol % ratio) was added to compensate for the loss of Bi during annealing. By using an x-ray diffractometer (XRD) (ATX-G, Rigaku, Japan), grazing incidence x-ray diffraction (GIXRD) was carried out to investigate the phase purity of the sol-gel prepared BFO thin film. The XRD results indicate that the BFO thin film is a pure phase after the heat treatment.

As described above, methyl methacrylate (MMA)-methacrylic acid (MAA) copolymer and polymethyl methacrylate (PMMA) were spun on various types of substrates sequentially as electron beam bilayer resist. Electron beam lithography (Quanta 600F, FEI Company, USA) was carried out to pattern arrays of disks or lines in the resist. After developing, BFO sol was spun on the substrate followed immediately by drying at 150° C. to gelate the sol. The samples were then soaked in acetone to lift off the electron beam resist, as well as excess BFO, from the unpatterned area. Crystalline BFO patterns were obtained after annealing at 600° C. for 30 min.

Figure 11A:
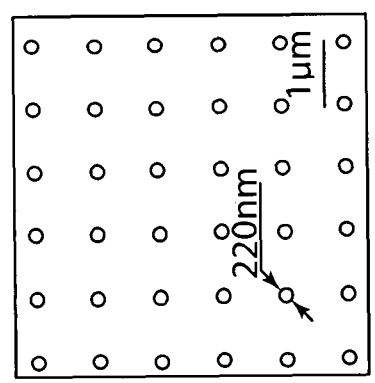
Figure 11B:
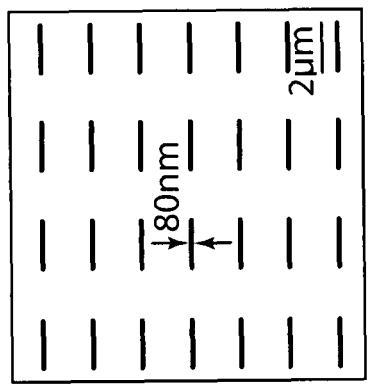
Figure 11C:
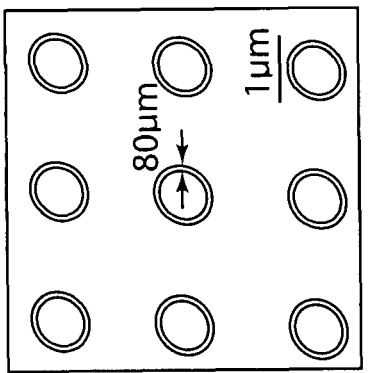
Figure 11D:
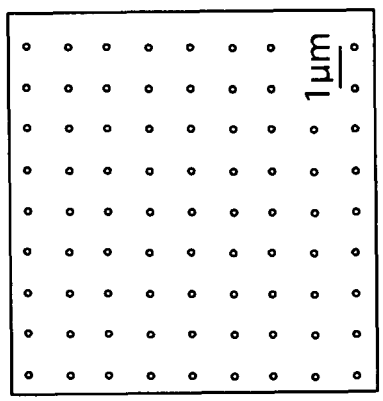
Figure 11E:
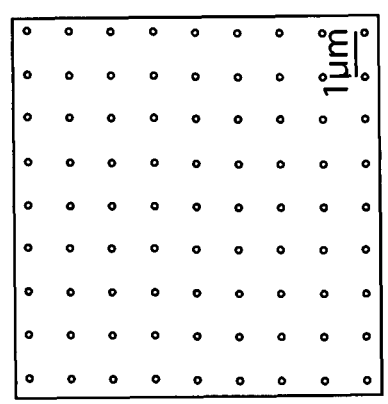

The morphology of the patterns was investigated with scanning electron microscopy (SEM) (Quanta 600F, FEI Company, USA) and atomic force microscopy (AFM) (Nanoscope III microscope, Digital Instruments, USA). A series of SEM images of BFO nanopatterns is shown in FIGS. 11a through 11e. FIG. 11a shows BFO nanodots of 220 nm in diameter on a Si wafer. FIG. 11b shows BFO nanorings with 80 nm of wall thickness patterned on Pt, which can serve as a bottom electrode for ferroelectric property measurement. BiFeO₃ nanolines with 80 nm of linewidth patterned on single crystalline (100) SrTiO₃ (STO) are shown in FIG. 11c. SrTiO₃ is also a technologically important substrate (especially for perovskite structured materials) to grow highly textured or epitaxial structures. It is observed that the unpatterned area was well lifted off and all patterns maintained good uniformity in size and shape after heat treatment. FIGS. 11d and 11e show SEM and tapping mode AFM images of BFO dots of 120 nm in diameter and 150 nm in height patterned on Pt. This sample was used for the ferroelectric property measurement as will be described later. The SEM and AFM images reveal the capability of method embodiment to fabricate solid structure with a dimension of less than 100 nm.

The BFO nanolines patterned on STO exhibit a "bamboo" structure, with the line width approaching the single-grain dimension as shown in the inset of FIG. 11c. It is well known that one of the major limitations of BFO is the high leakage current. Although oxygen vacancy is believed to be the origin of high conductivity, the contribution of impurity and structure defects, normally agglomerating in grain boundary, should not be ignored. Such a pattern contains a well-controlled grain boundary structure and thus serves as a model system for investigating the role of grain boundary in the leakage problem associated with BFO.

BiFeO₃ was also patterned as nanodots on an electron-transparent $SiN_x$ membrane with 50 nm thickness for direct observation under transmission electron microscopy (TEM) (Hitachi 8100, Japan). The TEM image of a BFO nanodot indicates the polycrystalline feature of the as-prepared BFO nanodot. The measured diameters of the SAD rings correspond well to the lattice spacing of rhombohedrally structured BFO. The chemical constituents of the BFO patterns were confirmed by the energy dispersive spectrum obtained from these nanodots wherein the signal of Si and N were generated by the membrane.

Figure 12A:
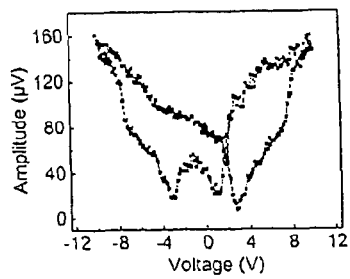
FIGS. 12a and 12b are graphs showing piezoelectric response of amplitude, FIG. 12a, and phase loops, FIG. 12b, to voltage measured at room temperature for a 100 nm BFO nanodot on Pt using PFM.
Figure 12B:
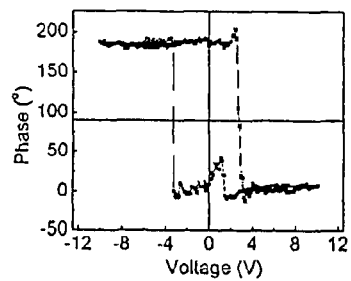

Piezoresponse force microscopy (PFM) was carried out in order to probe the ferroelectric behavior of the BFO nanopatterns. Piezoresponse force microscopy is a versatile technique, capable of not only domain structure imaging but also local hysteresis loop measurement. In this example, PFM was performed on BFO nanodots using a Nanoscope IV-Dimension 3100AFM (Digital Instrument, USA) equipped with a signal access module and an external lock-in amplifier (Signal Recovery Model 5210). Pt/Ti-coated conductive AFM probes (NSC18, MikroMaschm, USA), having a nominal force constant of 3 N/m, were used. In the experiment, a 5 kHz ac electric field plus a dc voltage was applied to an individual dot via the tip. FIGS. 12a and 12b show the typical loops of piezoresponse amplitude and phase versus the applied voltage, respectively. The amplitude loop displays a butterfly shape, which is typical for ferroelectric materials. Meanwhile, as the voltage changes from about +3 to −3 V, the 180° phase change indicates an unambiguous ferroelectric switch. Considering the height of the nanodot is about 150 nm, the specific coercive field is about 20 MV/m, close to the values published for BFO epitaxial thin films. These collective results validate the ferroelectric characteristics of the BFO nanopatterns.

Figure 13:
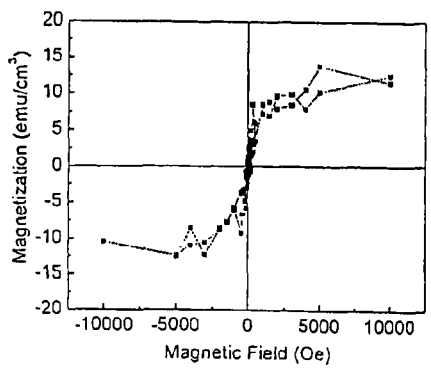
FIG. 13 shows a magnetic hysteresis loop measured at room temperature for BFO dots of 1 micrometer diameter patterned on Pt.

Magnetic hysteresis loop was determined at room temperature by using a superconducting quantum interference device magnetometer (MPSM-5, Quantum design, USA) and applying an out-of-plane magnetic field. In order to generate detectable signal, a large area of BFO patterns with a diameter of 1 μm was fabricated on platinized silicon substrate. FIG. 13 shows the hysteresis loop, which reveals a saturation magnetization of about 10 emu/cm³ in the magnetic field larger than 1000 Oe. BiFeO₃ is a G-type antiferromagnetic material which means that the spins in the adjacent Fe atoms are antiparallel. On the other hand, the spin-canting effect allows BFO to possess a weak macroscopic magnetization. Therefore, the hysteresis loop of BFO patterns does not show obvious remnant magnetization and coercive field. These results are consistent with the data already published for BFO thin films and confirm the multiferroic behavior of the BFO nanopatterns made by the method embodiment.

Multiferroic BFO nanopatterns with defined shape, size, and separation thus were fabricated on diverse substrates using this method embodiment. The coexistence of ferroelectric and ferromagnetic behavior at room temperature was demonstrated by PFM and the magnetic hysteresis loop, respectively. In addition, the BFO nanolines patterned on single crystal (100) STO substrate exhibit an interesting bamboolike microstructure that may prove useful in elucidating the role of grain boundaries on leakage current in BFO. The ability to fabricate multiferroic nanostructures not only opens up avenues for designing high-performance devices but also enables investigation of the size effect on multiferroic phenomena.

Example 8

The high surface-area-to-volume ratio of single-crystalline 1D (one dimensional) nanostructures such as nanowires, nanorods, and nanobelts structures makes them an obvious choice for potential applications involving surface-interface phenomena, such as gas-solid interactions in gas sensing and catalysis. There has been a strong correlation for such gas sensing elements between the sensitivity and grain size of sensing elements wherein higher sensitivity is generally associated with a smaller grain size. This example involves a fabrication embodiment to provide site specific positioning capability of beaded structures that are readily amenable to probing and evaluation.

For example, this example involves fabricating beaded nanostructures of technologically important ceramic materials such as zinc oxide and bismuth ferrite (BFO) using a method embodiment similar to FIG. 1 using a ZnO sol and a BFO sol prepared using chemicals purchased from Sigma-Aldrich Inc. and used without further purification. ZnO sol and BFO sol are prepared using procedures described in example 1 and example 7 respectively.

After electron beam lithography, the substrates were treated with oxygen plasma as described above for about 20 sec and spin-coated with a ZnO sol or BFO sol. Oxygen-plasma treatment was necessary to remove any residual resist material in the patterned locations and to make the substrate more hydrophilic, which was necessary to facilitate the flow of the liquid precursor into the patterned trenches. The precursor-coated substrate was then soaked in acetone to dissolve the resist and lift-off material outside the patterns, leaving solid structures with dimensions defined during the lithography step. These structures were subsequently annealed at various temperatures to remove organic components and to crystallize the ZnO or BFO material. Structural characterization of the crystallized material was performed using a Quanta 600F (FEI Co.) scanning electron microscope equipped with a field-emission electron gun and integrated with a nanopattern-generator lithography system for eBL capability. TEM was performed using a JEOL 2100 microscope.

Figure 14A:
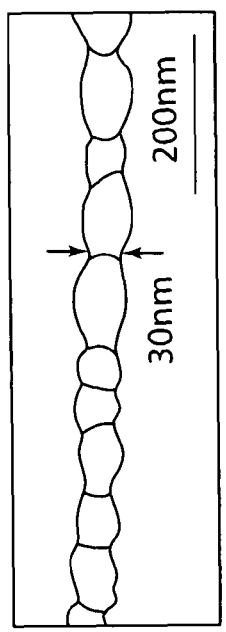
FIGS. 14a through 14c are SEM images of ZnO lines of different line widths fabricated on oxidized Si substrates and annealed at 900 degrees C. in air for 5 minutes.
Figure 14B:
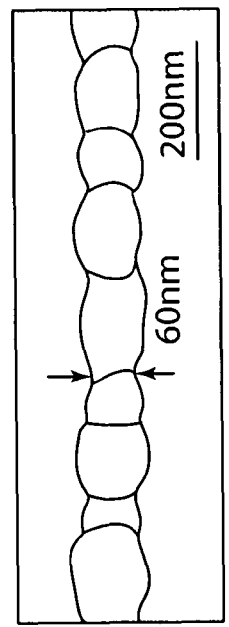
Figure 14C:
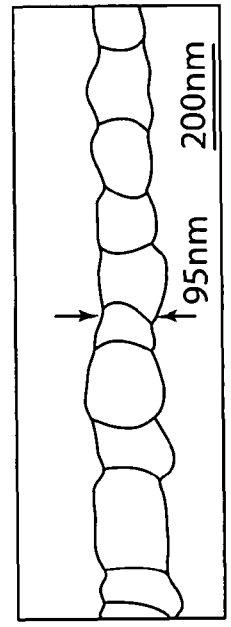
Figure 15A:
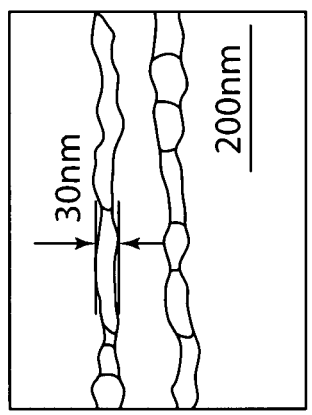
FIGS. 15a through 15d are SEM images of ZnO lines of different line widths fabricated on STO substrates and annealed at 600 degrees C. in air for 1 hr.
Figure 15B:
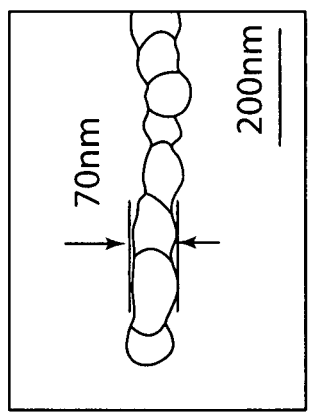
Figure 15C:
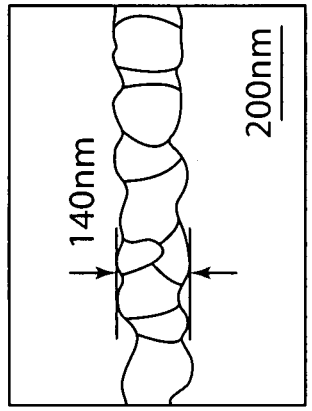
Figure 15D:
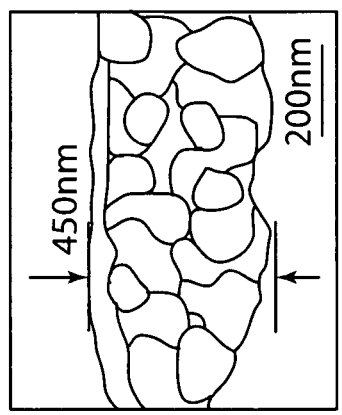
Figure 15E:
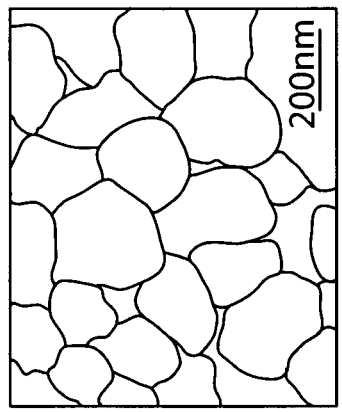
FIG. 15e is a SEM image of ZnO thin film fabricated on a STO substrate and annealed at 600 degrees C. in air for 1 hr.

This method embodiment was effective to fabricate ZnO ceramic structures with dimensions as small as 30 nm, which is comparable to the grain size. FIG. 14a through 14c show secondary electron images of ZnO lines, with various line widths, fabricated on oxidized silicon substrates. All patterns were annealed at 900° C. for 5 min in air through upquenching (samples were introduced into a furnace set at the annealing temperature). Cross-sectional images (obtained by imaging the tilted samples) and atomic force micros-copy images (not shown here) showed that the lines were of single-grain height and therefore columnar in nature. This was also confirmed by transmission electron microscopy (TEM). Measurement of the line dimensions before and after annealing revealed that the line width decreases by about 30%, whereas the line height decreases by about 50%. This corresponds to roughly 65% volume shrinkage. While such large volume shrinkages are not uncommon for structures fabricated using solution precursors, it is remarkable that these structures accommodate such large volume changes, and yet retain continuity between neighboring grains up to several micrometers along each line. A thin film of ZnO, also fabricated on an oxidized Si substrate by spinning the same solution precursor and was annealed in a similar way to the patterns at 900° C. for 5 min in air. The cross-sectional scanning electron micros-copy (SEM) image of this thin film also showed that the film thickness spanned a single grain and possessed columnar structure.

In order to study any morphological differences between 2D and 1D structures, namely the ZnO film and the ZnO lines, respectively, an average grain size for about 80 grains in each case was measured. These results reveal that the average grain size decreases monotonically with line width from about 80 nm in the thin film to less than 40 nm in the thinnest line. A similar size effect was also observed in a BFO system, as described below.

FIG. 15a through 15e show the SEM images of patterns and thin film of BFO fabricated on a single-crystalline strontium titanate (STO) substrate using the method embodiment similar to FIG. 1. The choice of STO as a substrate for BFO is motivated by the structural compatibility between these two materials, and the possibility of either strong texture or epitaxial growth of BFO on STO. The patterns and thin film were annealed in air at 600° C. for 1 h through upquenching. The average grain size in the BFO line patterns with different line widths decreases monotonically with the line width of BFO as with the ZnO line patterns.

The smaller grain size and reduced crystallization kinetics of the ZnO and BFO systems of this example have some useful practical implications, especially for sensors. Conventional gas sensors are operated at high temperatures (>300° C.) and their performance degrades with time. This degradation is referred to as drift, and is most commonly associated with a change in the microstructure of the sensor element caused by elevated-temperature operation. The reduced crystallization kinetics in the polycrystalline nanostructures could mean that they would be more stable at such operating temperatures.

This example demonstrates a method to fabricate single-grain-width polycrystalline lines of ceramic materials such as ZnO and BFO. Such beaded structures will be ideal samples for unambiguous evaluation of the role of grain boundaries in transport and related properties in functional device structures. The microstructural evaluation of these structures revealed a grain-size dependence on line width. As line width was reduced, grain size decreased. This may be due to reduced crystallization rate and higher nucleation density in dimensionally constrained systems, although Applicants do not intend to be bound by any theory in this regard.

Although the invention has been described with respect to certain illustrative embodiments, those skilled in the art will appreciate that changes and modifications can be made thereto within the scope of the invention as set forth in the appended claims.

We claim:

1. A method for forming a pattern of an inorganic material, comprising: a) patterning a resist-coated substrate using variable pressure electron beam lithography, b) surface treating the substrate after resist development, c) spin coating the patterned resist-coated substrate with a sol precursor of said inorganic material wherein the sol precursor comprises at least one of an inorganic sol precursor and an organic sol precursor followed by heating the spin coated substrate at a temperature to gelate the sol precursor, d) removing resist in solvent to leave a pattern with a lateral dimension that is less than 200 nm, and e) heating the coated substrate at an elevated temperature to crystallize the deposited sol precursor and convert it to ceramic material, wherein said ceramic material is a sub-200 nm sized structure in one or more of the following forms: (1) a ring or other annular structure with a lateral wall dimension less than 200 nm; (2) epitaxial single crystal structure with a lateral dimension less than 200 nm; and (3) beaded structure with a lateral dimension less than 200 nm.

2. The method of claim 1 wherein the substrate is selected from the group consisting of a noble metal, a semiconductor, and an oxide single crystal.

3. The method of claim 1 wherein the ceramic material comprises a ferroelectric oxide, ferromagnetic oxide, and/or an optoelectronic oxide.

4. The method of claim 1 including subjecting exposed regions of the patterned resist-coated substrate to an oxygen plasma treatment.

5. The method of claim 1 wherein grain size of said ceramic material of said beaded structure after crystallization of said ceramic material is controlled by the lateral dimension.

6. The method of claim 1 wherein the sol precursor is deposited on the single crystal substrate and heated at elevated temperature in a manner that the sol precursor crystallizes as a single crystal.

7. The method of claim 6 wherein the precursor crystallizes with epitaxy of the single crystal substrate.

8. A patterned structure, comprising a functional inorganic material, which exhibits single-crystalline character, on an underlying substrate and made by the method of claim 1.

9. The structure of claim 8 wherein the functional inorganic material exhibits single-crystalline character with epitaxial relationship with the underlying substrate.

10. The structure of claim 9 wherein the functional inorganic material is selected from the group consisting of oxide, carbide, nitride, sulphide, and arsenide.

11. The method of claim 1 including providing a bilayer resist on a substrate surface prior to patterning wherein the bilayer resist comprises a bottom, more electron beam-sensitive polymeric material and a top, less electron beam-sensitive polymeric material directly on the bottom polymeric material, patterning the bilayer resist and removing the patterned bilayer resist such that an undercut is formed in the remaining bottom, more electron beam-sensitive polymeric material, subjecting the exposed surface of the patterned resist-coated substrate to chemical surface modification to alter the exposed surface in a manner to control morphology of the deposited sol precursor in the subsequent spin coating step, and spin coating with the said sol precursor.

12. The method of claim 11 wherein a self-assembled monolayer (SAM) is provided on the exposed substrate surface prior to spin coating to improve the hydrophobicity of the exposed surface wherein the sol precursor is expelled to a wall of the resist pattern during spin coating to yield a ring or other annular morphology after drying with a lateral wall dimension less than 200 nm.

13. An annulus made by the method of claim 12.

14. The method of claim 12 including the further step of filling the ring or other annular morphology with a second, different sol precursor in a manner to fabricate a heterostructure on the substrate with a core-in-ring morphology with a ring wall width less than 200 nm.

15. A core-in-ring heterostructure made by the method of claim 14.

16. The method of claim 14 further including heating the second sol precursor at an elevated temperature to crystallize the deposited second sol precursor as the core-in-ring morphology.

* * * * *

UNITED STATES PATENT AND TRADEMARK OFFICE
CERTIFICATE OF CORRECTION

PATENT NO. : 8,647,814 B2  Page 1 of 1
APPLICATION NO. : 11/805546
DATED : February 11, 2014
INVENTOR(S) : Vinayak P. Dravid, Suresh K. Donthu and Zixiao Pan It is certified that error appears in the above-identified patent and that said Letters Patent is hereby corrected as shown below:

In the Specifications

At column 1, lines 9-16, replace the paragraph entitled "CONTRACTUAL ORIGIN OF THE INVENTION" with:

-- CONTRACTUAL ORIGIN OF THE INVENTION

This invention was made with government support under grant number EEC0118025 awarded by the National Science Foundation. The government has certain rights in the invention. --

Signed and Sealed this
Twenty-second Day of April, 2014

Michelle K. Lee
*Deputy Director of the United States Patent and Trademark Office*